Nov. 18, 1969 G. YANISHEVSKY ET AL 3,479,553
DEFLECTION AMPLIFIER
Original Filed Sept. 22, 1967
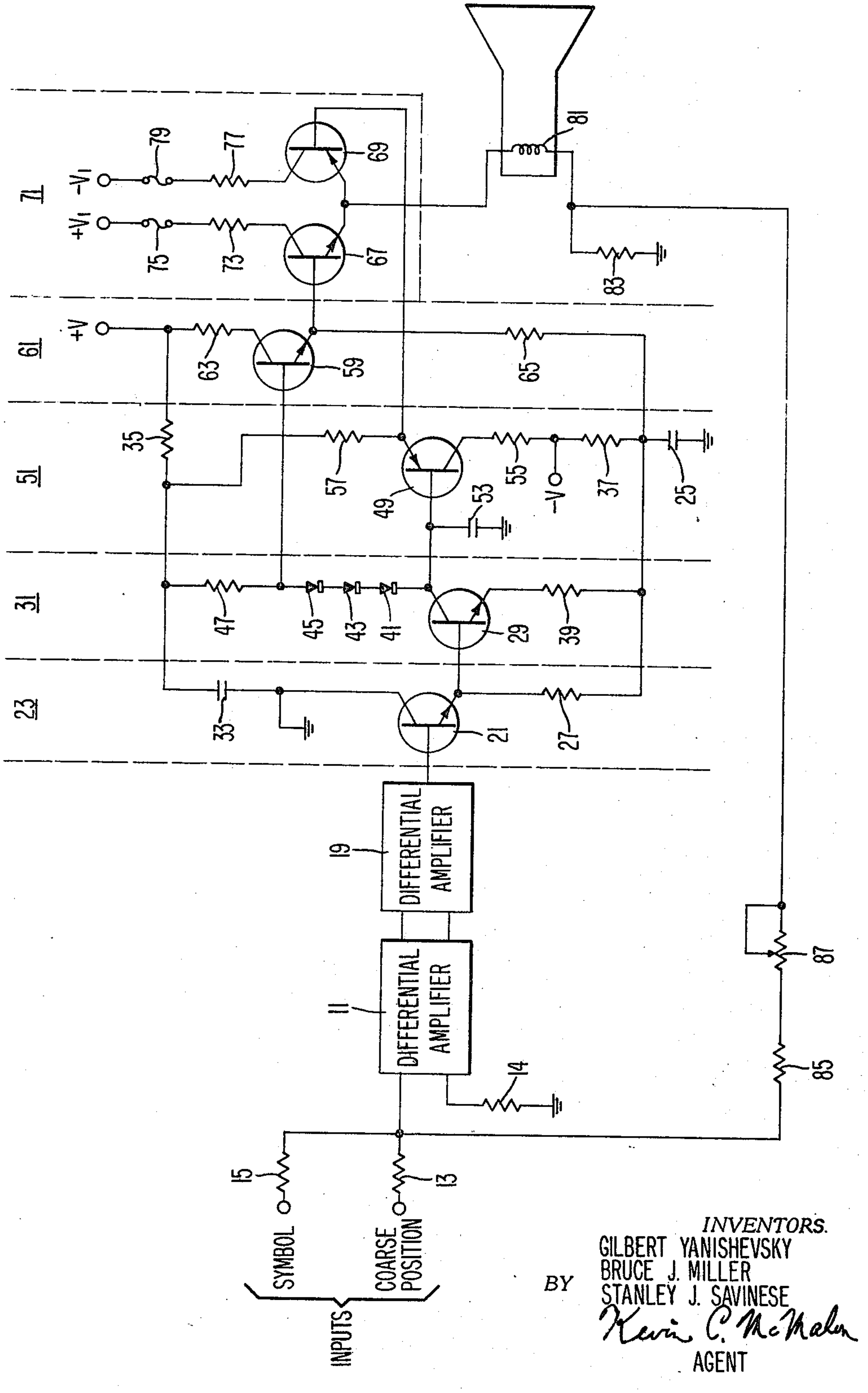
INVENTORS.
GILBERT YANISHEVSKY
BRUCE J. MILLER
STANLEY J. SAVINESE
BY Kevin C. McMahon
AGENT

United States Patent Office 3,479,553

Patented Nov. 18, 1969

3,479,553

DEFLECTION AMPLIFIER

Gilbert Yanishevsky, Philadelphia, Bruce J. Miller, Malvern, and Stanley J. Savinese, Ridley Park, Pa., assignors to Burroughs Corporation, Detroit, Mich., a corporation of Michigan Continuation of application Ser. No. 669,848, Sept. 22, 1967. This application Nov. 5, 1968, Ser. No. 774,593

Int. Cl. H01j *29/10*

U.S. Cl. 315—18 10 Claims

ABSTRACT OF THE DISCLOSURE

A deflection amplifier including cascaded differential amplifiers is connected through a buffer to the input of an inverting amplifier. The output of the inverting amplifier is connected to separate plus and minus drivers which in turn drive a deflection yoke through a push-pull output stage. Series connected, forward biased diodes are included in the inverting amplifier circuit for maintaining a constant compensating voltage difference between the inputs to the drivers. The gain and frequency response of the amplifier are controlled by a degenerative feedback path.

BACKGROUND OF THE INVENTION

This case is a continuation of application Ser. No. 669,-848, filed Sept. 22, 1967, now abandoned.

This invention relates generally to amplifiers and more particularly to solid state amplifiers which are especially useful in driving the deflection yoke of a magnetically controlled cathode ray tube.

The deflection of a cathode ray tube beam is generally performed by the use of either one of two common types of circuits, i.e., electrostatic or magnetic circuits. Electrostatic deflection requires the use of high voltage circuitry and power supplies which technically preclude the use of solid state components such as transistors therein. The vacuum tube circuitry necessary in the system is bulky, heat generating and power consuming. Also, extreme caution is required in service, repair and maintenance because of the high voltages present and fragile components.

Magnetic beam deflection circuits have been known for some time but involve certain peculiar deficiencies. The circuits of this type using vacuum tubes are not suitable for random high speed beam deflection because of their long settling times. Solid state circuits such as that disclosed in Patent No. 3,303,380 to J. L. Kozikowski and assigned to the same assignee as the present invention have been used for magnetic beam deflection systems. Until now however, they have been capable of operation over only a relatively narrow bandwidth and have required high output currents since they are not suitable for driving high inductance yokes over a wide bandwidth. Furthermore, many of them are extremely expensive. Anoher serious difficulty which has been experienced in deflection amplifiers of this type is a lack of linearity as the output passes through zero.

OBJECTIVES AND SUMMARY OF THE INVENTION

It is therefore an object of this invention to improve solid state amplifiers suitable for the random high speed magnetic deflection of a cathode ray tube beam.

A further object of this invention is to provide a low-cost solid state magnetic beam deflection circuit operable over a wide bandwidth.

A further object of this invention is to provide a solid state magnetic beam deflection circuit which is able to drive relatively high inductance yokes.

A still further object of the invention is to provide a magnetic deflection amplifier which is linear over its range.

In accordance with these and other objects of the invention there is provided a solid state amplifier suitable for use in magnetic high speed, random cathode ray tube beam deflection systems comprising high input impedance means for providing voltage and current amplification of input signals and push-pull connected output means including two opposite conductivity transistors having their emitters connected to one side of an output impedance for supplying output current to said impedance. Separate transistor driver means are connected to said output transistors for supplying input drive current to said output transistors. The inputs of the driver circuits are coupled to the output of the voltage and current amplification means. Means are included in the current and voltage amplification means for maintaining a substantially constant voltage difference between the inputs of said separate driver means for compensating for voltage drops in said driver and output means transistors. Means are also provided for degeneratively feeding back to the input of the current and voltage amplification means signals having substantially the same waveshape as the deflecting current.

Various other objects and advantages and features of the invention will become more fully apparent in the following specification with its appended claims and accompanying drawing in which:

BRIEF DESCRIPTION OF THE DRAWING

The single figure of the drawing shows a circuit embodying the invention, shown partially in block diagram form and partially in schematic form.

DETAILED DESCRIPTION

The invention can best be understood by referring to the following detailed description of the illustrated embodiment.

In electronic character generating and display apparatus it is desirable to be able to position the character or symbol at random, i.e., at any desired spot on the display device such as a cathode ray tube screen. The character or symbol may be located at the bottom, middle or, top, left or right, or at any other intermediate position or location chosen for the particular display. The system which produces the symbol or character must not only "coarse" locate the character on the screen of the tube, but must also have sufficient frequency response to clearly trace out (form) the character at the spot chosen for its display. Two deflection systems are required, one for horizontal and one for vertical beam deflection.

In a system in which the apparatus of this invention may be employed, the signal input is a voltage, while the output signal is a current. The output load in this instance may be a yoke coil of a cathode ray tube. It is desirable to produce as linear a relationship as possible between the input voltage and the output current in the yoke since this type of apparatus involves relatively high currents and low impedances. The solid state design approach lends itself admirably to this type of circuit design.

Referring now to drawing the symbol and coarse position signal inputs are connected to one input of differential amplifier 11 through resistors 15 and 13, respectively. The other input of differential amplifier 11 is connected to ground through resistor 14. The double-ended outputs of differential amplifier 11 are connected to the inputs of differential amplifier 19 whose output is coupled to the base of emitter follower connected NPN transistor 21 of buffer circuit 23. The collector of transistor 21 is grounded and the emitter is connected to the ungrounded side of regulator capacitor 25 through resistor 27. The output of buffer circuit 23 is taken from the emitter of transistor 21 which is coupled to the base of NPN transistor 29 of amplifier circuit 31.

One side of voltage regulator capacitor 33 is grounded and the other side is connected to voltage source +V through voltage dropping resistor 35. One end of voltage regulator capacitor 25 is grounded while the other end is connected to voltage source —V through voltage dropping resistor 37.

The emitter of transistor 29 is connected to the ungrounded side of regulator capacitor 25 through resistor 39. The collector of transistor 29 is connected to the ungrounded side of regulator capacitor 33 through diodes 41, 43, 45 and resistor 47 all of which are connected in series. The amplifier circuit 31 has two outputs taken from either side of the set of series connected diodes 41, 43 and 45. The negative-going output signals are taken from the collector connected end of the series diodes which is coupled to the base of PNP transistor 49 of minus driver circuit 51. Roll off capacitor 53 is connected between the base of transistor 49 and ground. The collector of transistor 49 is connected to the voltage source —V through resistor 55 while its emitter is connected to the ungrounded side of regulator capacitor 33 through resistor 57.

The positive-going output signals from amplifier 31 are taken from the other output of amplifier 31 which is coupled to emitter-follower connected NPN transistor 59 of plus driver circuit 61. The collector of transistor 59 is connected to voltage source +V through resistor 63 while its emitter is connected to the ungrounded side of regulator capacitor 25 through resistor 65. The outputs of the plus and minus driver circuits are taken from the emitters of transistors 59 and 49, respectively, which are connected to the bases of push-pull connected transistors 67 and 69, respectively, of output circuit 71. The collector of transistor 67 is connected to voltage source $+V_1$ through series connected resistor 73 and fuse 75. The collector of transistor 69 is connected to voltage source $-V_1$ through series connected resistor 77 and fuse 79. The output of the output stage is taken from the emitters of transistors 67 and 69 and is connected to one side of the deflection yoke coil 81. The other end of the yoke coil 81 is connected to ground through sampler resistor 83.

The signal at the ungrounded side of the sampler resistor 83 is fed back to the control signal connected input of differential amplifier 11 through series connected resistor 85 and potentiometer 87.

In operation the gross position of the beam on the face of the cathode ray tube is controlled by the coarse position input through resistor 13. After the coarse beam position is determined the symbol input is used to make the beam trace out the symbol or character.

Both of the input signals are fed into one input of differential amplifier 11 which provides impedance matching and voltage gain. Differential amplifier 19 further amplifies the output of differential amplifier 11 and feeds its single ended output into the input of buffer stage 23 which has a high input impedance so as not to load down the differential amplifier 19. The output of the buffer stage which is taken from the emitter of the emitter follower connected transistor 21 is coupled to the base of the common emitter connected transistor 29 of amplifier 31. The output of amplifier 31 can swing almost the full range between ±V thereby further providing voltage gain to the output of buffer stage 23 which swings between 0 and —V. The common emitter connected amplifier 31 has an inherent inverting function. Therefore, the output of differential amplifier 19 must be taken from the correct side of the amplifier so that the output of amplifier 31 is of proper polarity to drive in the correct direction the output transistors 67 and 69 through plus and minus drivers 61 and 51, respectively.

The voltage at the ungrounded ends of capacitors 33 and 25 are very close to +V and —V, respectively, since resistors 35 and 37 are quite small and only a small amount of voltage drops across them. Capacitors 33 and 25 perform a regulating function, protecting the circuit from changes in value of the supply voltages, +V and —V. The voltage drops across resistors 35 and 37 are so small it will be assumed that the voltages at the ungrounded ends of capacitors 23 and 35 are equal to their respective supply voltages.

When the collector of transistor 29 is positive, output transistor 67 is biased "on" through plus driver circuit transistor 59 and output transistor 69 if cut-off. When the voltage at the collector of transistor 29 is negative, the opposite situation pertains and transistor 69 is biased "on" through minus driver circuit transistor 49 and transistor 67 is cut-off. If, for instance, the voltage at the collector of transistor 29 is +5 volts the voltage at the base of the plus driver circuit transistor 59 is at approximately 7.1 volts due to the voltage drop across the series connected diodes 41, 43 and 45. Therefore, the voltage at the base of transistor 67 is approximately 6.4 volts and the voltage at the base of transistor 69 is approximately 5.7 volts due to the base-emitter junction voltage drops across transistors 59 and 49, respectively. Transistor 67 is biased "on" and the voltage at its emitter is approximately 5.7 volts. Thus, the voltages at the base and emitter of transistor 69 are equal and it is nonconducting.

If no input signal is present, the voltage at the collector of transistor 29 is approximately −1 volt and the voltage at the other end of the series connected diodes is approximately +1 volt. This results in a voltage of approximately +.3 volt at the base of transistor 67 and —.3 volt at the base of transistor 69 thus causing both output transistors to be non-conducting and a zero voltage drop to exist across the deflection yoke 81.

The series connected diodes 41, 43 and 45 are used in the inverter stage to prevent cross-over distortion which would otherwise occur as the yoke current goes through zero. The diodes are forward biased when transistor 29 is conducting and have a drop of approximately 2.1 volts across them. This compensates for the base to emitter voltage drops across driver transistors 49 and 59 and output transistors 67 and 69.

The detailed circuitry of differential amplifiers 11 and 19 has not been shown since they are well known in the art. Any type can be used as long as it has a quiescent output voltage level such that under no signal conditions there is no current through the yoke and the beam is undeflected. They should also have a high input impedance to prevent loading on the input circuits and of differential amplifier 19 on differential amplifier 19 on differential amplifier 11. This may be obtained by including emitter follower connected transistors in their input circuits.

Feedback resistors 85 and 87 are included to control the overall gain of the amplifier. The open-loop gain of the circuit is extremely large so that even a very small input signal would generate a large yoke current with the result that the system would be extremely sensitive to noise voltages and almost impossible to control. The inclusion of the feedback resistors lowers the gain to such a point that, if the series resistance of potentiometer 87 and resistor 85 is equal to the input resistors 13 or 15, the voltage at the ungrounded end of sampler resistor 83 is approximately equal to the input voltage. Therefore the amount of current through deflection yoke 81 is determined by the value of sampler resistor 83. The closed loop voltage gain of the system may be controlled by adjusting the potentiometer 87.

Emitter follower connected driver circuits 51 and 61 are used to prevent voltage changes caused by the reactive impedance of yoke 81 from being reflected back to the high voltage gain portions of the amplifier. Such reflection back might cause improper operation of the circuit.

With the component values as listed below, the circuit is capable of supplying current between +4 amperes and −4 amperes to the deflection yoke 81.

The following component values have been found to be suitable for use in the circuit.

| Component: | Value |
|---|---|
| Resistors— | |
| 13 | 5.1K |
| 15 | 5.1K |
| 14 | 2K |
| Transistor 21 | 2N3904 |
| Capacitor 25 ___ μf | 200 |
| Resistor 27 | 1K |
| Transistor 29 | 2N698 |
| Capacitor 33 ___ μf | 200 |
| Resistors— | |
| 35 | 4.7K |
| 37 | 4.7K |
| 39 | 91 |
| 47 | 680 |
| Transistor 49 | 2N4036 |
| Capacitor 53 ___ μμf | 390 |
| Resistors— | |
| 55 | 47 |
| 57 | 6800 |
| Transistor 59 | 2N698 |
| Resistors— | |
| 63 | 47 |
| 65 | 6800 |
| Transistors— | |
| 67 | 2N3715 |
| 69 | 2N3791 |
| Resistors— | |
| 73 | 2 |
| 77 | 2 |
| Deflection yoke 81 ___ μh | 70 |
| Resistors— | |
| 83 | 1 |
| 85 | 3900 |
| Potentiometer 81 | 1K |
| ±V ___ v | ±22 |
| $\pm V_1$ ___ v | ±26 |

All values of resistance are given in ohms, or kilo-ohms where specified.

With these component values the small signal bandwidth is in excess of one megacycle for current outputs in the order of 50 milliamperes peak-to-peak.

It should be understood that the above description of the particular configuration and environment of this invention is by way of illustration only and that the circuit clearly could find uses in fields other than deflection amplifiers for cathode ray tubes.

What is claimed is:

1. A solid-state amplifier for supplying a controllable current to an output impedance in response to an input voltage signal comprising:

amplification means for providing amplification to said input signal;

output means including two push-pull connected oppositely conductive transistors having their emitters connected to one end of said output impedance for supplying output current to said impedance;

separate transistor driver means for each of said push-pull connected transistors for supplying input drive current to said push-pull connected transistors, the input of said separate driver means being coupled to the output of said amplification means; and means included in said amplification means for providing a voltage difference between the inputs of said separate driver means for compensating for different voltage drops in said driver means and output means.

2. The amplifier of claim 1 wherein said amplification means includes:

differential amplifier means for amplifying said input signal;

high input impedance buffering means connected to the output of said differential amplifier means for providing isolation and current amplification to the output signal of said differential amplifier means; and common emitter connected transistor amplifier means coupled to said buffering means and having said means for providing a voltage difference between the inputs of said separate driver means connected in its collector circuit.

3. The amplifier of claim 1 wherein said means for providing a voltage difference between the inputs of said separate driver means comprises means for maintaining a substantially constant voltage difference between said driver inputs.

4. The amplifier of claim 3 wherein said means for maintaining a substantially constant voltage difference between the inputs of the separate driver means includes a plurality of series-connected forward-biased diodes.

5. The amplifier of claim 1 wherein said separate driver means each include emitter-follower connected transistors each of them being of the same conductivity type as the output means transistor to which it is coupled.

6. The amplifier of claim 1 further comprising degenerative feedback means coupled between the other end of said output impedance and the input of said amplification means and including a potentiometer connected for varying the gain of said amplifier.

7. A solid-state deflection amplifier for supplying a controllable current to the deflection yoke of a cathode ray tube in response to an input signal comprising:

differential amplifier means for amplifying said input signal;

amplifying means connected to the output of said differential amplifier means for providing amplification to the output signal of said differential amplifier means;

an output circuit including two push-pull connected oppositely conductive transistors having their emitters connected to one end of said deflection yoke for supplying current in either direction to said yoke;

separate transistor driver circuits for each of said push-pull connected transistors for supplying driving power to said output circuit transistors, the inputs of said driver circuits being connected to said amplifying means;

means included in said amplifying means for providing a voltage difference between the inputs of said separate driver circuits for compensating for different voltage drops in said driver and output circuit transistors; and degenerative feedback means connected between the other end of said deflection yoke and the input of said differential amplifier means for controlling the gain and frequency response of the deflection amplifier.

8. The amplifier of claim 7 wherein said means for providing a voltage difference between the inputs of the separate driver means comprises means for maintaining a substantially constant voltage difference between said driver inputs.

9. The amplifier of claim 8 wherein said driver circuits each include an emitter-follower connected transistor of the same conductivity as the output circuit transistor to which it is connected and said means for maintaining a substantially constant voltage difference between the inputs of said separate driver means includes at least one series-connected forward-biased diode.

10. A solid state deflection amplifier for supplying a controllable current to the deflection yoke of a cathode ray tube in response to input voltage signals comprising:

at least one differential amplifier, said input signals being connected to the input of said differential amplifier;

a common emitter connected transistor amplifier connected to the output of said amplifier;

an output circuit including two push-pull connected oppositely conductive transistors having their emitters connected to one end of said deflection yoke for supplying output current to said yoke in either direction;

separate transistor driver circuits connected to the inputs of said push-pull connected transistors, the drive circuit transistors being of the same conductivity as the output transistors to which they are connected;

means connected in the collector circuit of said common emitter amplifier providing a substantially constant voltage difference between the inputs of said separate driver circuits for compensating for voltage drops in said driver and output circuit transistors; and a degenerative variable feedback resistive circuit connected between the other end of the deflection yoke and the input of the first differential amplifier for controlling the gain and frequency response of said deflection amplifier.

References Cited

UNITED STATES PATENTS

| | | | |
|---|---|---|---|
| 2,964,673 | 12/1960 | Stanley | 315—27 X |
| 3,348,160 | 10/1967 | Lee et al. | 330—122 X |

RODNEY D. BENNETT, Jr., Primary Examiner

BRIAN L. RIBANDO, Assistant Examiner

U.S. Cl. X.R.

307—228; 330—122